(12) United States Patent
Lindahl et al.

(10) Patent No.: US 10,745,810 B2
(45) Date of Patent: Aug. 18, 2020

(54) CVD COATED CUTTING TOOL WITH {0 0 1} TEXTURED κ-AL₂O₃ LAYER

(71) Applicant: SANDVIK INTELECTUAL PROPERTY AB, Sandviken (SE)

(72) Inventors: Erik Lindahl, Sandviken (SE); Jan Engqvist, Sandviken (SE)

(73) Assignee: SANDVIK INTELLECTUAL PROPERTY AB, Sandviken (SE)

(*) Notice: Subject to any disclaimer, the term of this patent is extended or adjusted under 35 U.S.C. 154(b) by 340 days.

(21) Appl. No.: 15/637,308

(22) Filed: Jun. 29, 2017

(65) Prior Publication Data
US 2018/0002817 A1    Jan. 4, 2018

(30) Foreign Application Priority Data
Jul. 1, 2016    (EP) .................... 16177598

(51) Int. Cl.
| | | |
|---|---|---|
| *C01F 7/02* | (2006.01) | |
| *C01G 19/00* | (2006.01) | |
| *G01N 23/20* | (2018.01) | |
| *C23C 30/00* | (2006.01) | |
| *C23C 16/02* | (2006.01) | |
| *C23C 16/40* | (2006.01) | |

(52) U.S. Cl.
CPC .......... *C23C 30/00* (2013.01); *C23C 16/0272* (2013.01); *C23C 16/403* (2013.01); *C23C 30/005* (2013.01); *C01F 7/02* (2013.01); *C01G 19/00* (2013.01); *G01N 23/20075* (2013.01)

(58) Field of Classification Search
CPC ....................................................... C23C 16/30
See application file for complete search history.

(56) References Cited

U.S. PATENT DOCUMENTS

| | | | | |
|---|---|---|---|---|
| 5,137,774 A | * | 8/1992 | Ruppi ..................... | C23C 16/30 428/212 |
| 5,968,595 A | * | 10/1999 | Kutscher ............... | C23C 16/403 427/255.19 |
| 6,062,776 A | | 5/2000 | Sandman et al. | |
| 6,689,450 B2 | | 2/2004 | Sakari | |

FOREIGN PATENT DOCUMENTS

| | | |
|---|---|---|
| EP | 0753602 A1 | 1/1997 |
| RU | 2010888 C1 | 4/1994 |
| WO | 98/28464 A1 | 7/1998 |

* cited by examiner

*Primary Examiner* — Ian A Rummel
(74) *Attorney, Agent, or Firm* — Corinne R. Gorski

(57) ABSTRACT

The present disclosure relates to a coated cutting tool having a substrate and a coating, wherein the coating includes at least one layer of κ-Al₂O₃ with a thickness of 1-20 μm deposited by chemical vapour deposition (CVD). A χ-scan from −80° to 80° over the (0 0 6) reflection of the κ-Al₂O₃ layer shows the strongest peak centered around 0° and the full width half maximum (FWHM) of the peak is <25°.

13 Claims, 5 Drawing Sheets

CVD COATED CUTTING TOOL WITH {0 0 1} TEXTURED κ-AL$_2$O$_3$ LAYER

RELATED APPLICATION DATA

This application claims priority under 35 U.S.C. § 119 to EP Patent Application No. 1617798.6, filed on Jul. 1, 2016, which the entirety thereof is incorporated herein by reference.

TECHNICAL FIELD

The present disclosure relates to a CVD coated cutting tool including a substrate and a coating, wherein the coating includes at least one κ-Al$_2$O$_3$ layer.

BACKGROUND

In the technical area of cutting tools for metal machining, the usage of CVD coatings is a well-known method to enhance the wear resistance of the tool. CVD coatings of ceramic materials such as TiN, TiC, TiCN and Al$_2$O$_3$ are commonly used.

The knowledge of the wear resistance of Al$_2$O$_3$ coatings has increased during the years and properties of different Al$_2$O$_3$ coatings have been studied in detail in several disclosures.

κ-Al$_2$O$_3$ coatings are different from α-Al$_2$O$_3$ coatings in that the crystal structure differs. α-Al$_2$O$_3$ coatings are known to provide a high crater wear resistance in metal cutting in for example ball bearing steel, while κ-Al$_2$O$_3$ coatings are known to be less performing in such an application. κ-Al$_2$O$_3$ coatings are on the other hand known to perform in for example stainless steel.

EP0753602 A1 discloses a cutting tool comprising a κ-Al$_2$O$_3$ coating with a preferred crystal growth orientation in the <2 1 0> direction, which tool exhibits increased wear properties in machining of ball bearing steel.

SUMMARY

It is an object of the present invention to provide a coated cutting tool having a κ-Al$_2$O$_3$ layer that exhibits improved cutting properties in turning, milling and/or drilling. It is a further object to provide a cutting tool with improved crater wear resistance in turning and milling of steel, ball bearing steel and alloy steel such as stainless steel.

The present invention relates to a coated cutting tool including a substrate and a coating, wherein the coating has at least one layer of κ-Al$_2$O$_3$ with a thickness of 1-20 μm deposited by chemical vapor deposition (CVD), wherein a χ-scan from −80° to 80° over the (0 0 6) reflection of said κ-Al$_2$O$_3$ layer shows the strongest peak centered around 0° and wherein the full width half maximum (FWHM) of said peak is <25°, preferably <20°, more preferably <18°.

The substrate is made of cemented carbide, cermet, ceramic or a super hard material such as cBN.

The κ-Al$_2$O$_3$ layer is typically deposited by thermal CVD. Alternatively other CVD deposition processes can be used. This is also the case for any further layers of the coating as disclosed below.

The FWHM of said peak is <25°, preferably <20°, more preferably <18°. The FWHM is the width of the peak at half its maximum height. Generally, the narrower the peak is, the more well-textured or well-oriented is the layer.

The coated cutting tool of the present disclosure has a new and improved κ-Al$_2$O$_3$ layer where the layer includes a high fraction of {0 0 1} planes in parallel with the surface of the substrate. The layer has surprisingly shown to provide improved crater wear resistance. This wear resistance is very useful for cutting tools used in for example turning operations, such as turning of steel.

In one embodiment of the coated cutting tool of the present invention the strongest peak from the κ-Al$_2$O$_3$ layer in an X-ray diffractogram from 15° to 140° is the (0 0 2) reflection. The second strongest peak may be from the (0 0 4) reflection. The third strongest peak may be from the (0 0 6) reflection. A high {0 0 1} texture of the κ-Al$_2$O$_3$ layer has shown to improve the wear resistance of the κ-Al$_2$O$_3$ layer.

In one embodiment of the present invention the average thickness of the κ-Al$_2$O$_3$ layer is 2-10 μm, preferably 3-7 μm.

In one embodiment of the present invention the coating further includes a α-Al$_2$O$_3$ layer. The α-Al$_2$O$_3$ layer may be located between the κ-Al$_2$O$_3$ layer and the substrate. The α-Al$_2$O$_3$ layer is preferably a layer with a high fraction of {0 0 1} planes in parallel with the surface of the substrate, more preferably the fraction of {0 0 1} planes in parallel with the surface of the substrate are dominating. A {0 0 1} texture in said α-Al$_2$O$_3$ layer can be utilized to form a strong {0 0 1} texture in a subsequent κ-Al$_2$O$_3$ layer. In one embodiment said α-Al$_2$O$_3$ layer exhibits a χ-scan from −80° to 80° over the (0 0 12) reflection of said α-Al$_2$O$_3$ layer that shows the strongest peak centered around 0° and wherein the FWHM of said peak is 5°, preferably 0°, more preferably 18°.

In one embodiment of the present invention the thickness of said α-Al$_2$O$_3$ layer is 0.5-2 μm, preferably 0.7-1 μm.

In one embodiment of the present invention the coating further includes one or more layers of TiN, TiCN, TiC, TiCO, TiAlCO and TiCNO.

In one embodiment a TiCN layer may be located between said α-Al$_2$O$_3$ layer and the substrate. The TiCN layer is preferably columnar. The TiCN layer is preferably a layer with a high fraction of {2 1 1}, {3 1 1} and {1 1 1} planes in parallel with the surface of the substrate, more preferably the fraction of {2 1 1}, {3 1 1} and {1 1 1} planes in parallel with the surface of the substrate are dominating, i.e. the intensities of the reflection from these planes are of the highest intensity in an XRD diffractogram. This texture in said TiCN layer can be utilized to form a strong 0 0 1 texture in a subsequent α-Al$_2$O$_3$ layer.

In one embodiment of the present invention a layer of one or more of TiN, TiC, TiCN, TiCO, TiAlCO, TiCNO is located between said α-Al$_2$O$_3$ layer and said κ-Al$_2$O$_3$ layer. In one embodiment said α-Al$_2$O$_3$ layer and said κ-Al$_2$O$_3$ layer are separated by a layer of one or more of TiN, TiC, TiCN, TiCO, TiAlCO, TiCNO, preferably TiN, TiC and/or TiCN, most preferably TiN. The layer separating said α-Al$_2$O$_3$ layer and said κ-Al$_2$O$_3$ layer is preferably {1 1 1} textured. In one embodiment the κ-Al$_2$O$_3$ layer of the present invention is in direct contact with and grown directly on a {1 1 1} textured TiN layer.

In one embodiment of the present invention the thickness of said layer of one or more of TiN, TiC, TiCN, TiCO, TiCNO, TiAlCO located between said α-Al$_2$O$_3$ layer and said κ-Al$_2$O$_3$ layer is 0.5 μm, preferably between 0.02 μm and 0.5 μm, more preferably 0.4 μm or 0.3 μm or 0.2 μm. This layer should be deposited to cover the α-Al$_2$O$_3$ but can be very thin.

In one embodiment of the present invention the coating includes layers in the following order as seen from the surface of the substrate TiN, TiCN, TiCNO, α-Al$_2$O$_3$, TiN and κ-Al$_2$O$_3$.

In one embodiment of the present invention the coating has an outermost wear indicating color layer such as TiN.

Still other objects and features of the present invention will become apparent from the following detailed description considered in conjunction with the accompanying drawings.

DETAILED DESCRIPTION

XRD Examination

Figure 1:
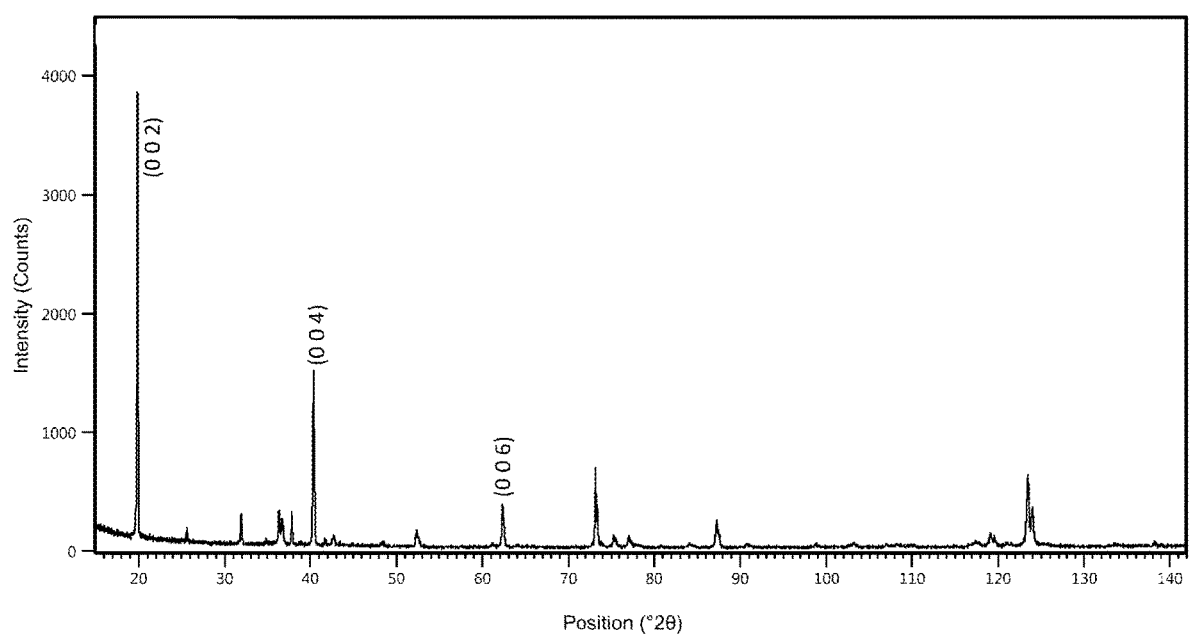
FIG. 1 is a θ-2θ XRD diffractogram from Sample B with no corrections applied on the intensities.

In order to investigate the texture of the κ-$Al_2O_3$ layer X-ray diffraction (XRD) was conducted on the flank face using a PANalytical CubiX3 diffractometer equipped with a PIXcel detector. The coated cutting tools were mounted in sample holders to ensure that the flank face of the samples were parallel to the reference surface of the sample holder and also that the flank face was at appropriate height. Cu-Kα radiation was used for the measurements, with a voltage of 45 kV and a current of 40 mA. Anti-scatter slit of ½ degree and divergence slit of ¼ degree were used. The diffracted intensity from the coated cutting tool was measured in the range 15° to 140° 2θ, i.e. over an incident angle θ range from 7.5 to 70°.

A common way to analyze the texture of a polycrystalline film is to calculate texture coefficients (TC) based on Harris formula and standard intensity PDF cards. The out of plane texture for κ-$Al_2O_3$ alumina is however hard to determine from calculation of texture coefficients since the crystal structure of κ-$Al_2O_3$ has a low symmetry and therefore there are many peaks of low intensity in the diffractogram. Also there are a lot of overlapping peaks. Therefore the peak of the highest intensity of the κ-$Al_2O_3$ layer is selected here as a measure of the texture of the layer. Selected κ-$Al_2O_3$ XRD peaks which had no (or very limited) peak overlap in the XRD diffractogram and are either strong in the κ-layer of the invention or are strong in a randomly oriented powder according to PDF card 00-52-0803 were used to evaluate the texture of the κ-$Al_2O_3$ layer (κ-$Al_2O_3$ peaks: (0 0 2), (0 1 3), (1 2 2), (0 0 4) and (0 0 6)).

Since the κ-$Al_2O_3$ layer was a finitely thick film the relative intensities of peaks at different 2θ angles are different than they are for bulk samples, due to the differences in path length through the layer. Therefore, thin film correction was applied to the peak intensities, taken into account the linear absorption coefficient of the layer. Since possible further layers above for example the κ-$Al_2O_3$ layer will affect the X-ray intensities entering the κ-$Al_2O_3$ layer and exiting the whole coating, corrections need to be made for these as well, taken into account the linear absorption coefficient for the respective compound in a layer. Any further layers, such as TiN, above an alumina layer can be removed by a method that does not substantially influence the XRD measurement results, e.g. chemical etching.

Pole Figure and χ-Scan

Textured κ-$Al_2O_3$ layers were analyzed by XRD on a PANalytical MRD diffractometer with an Euler cradle. The diffractometer was operated in point focus and was equipped with a primary polycapillary lens and a cross slit. The cross slit was set to 2×2 mm. The diffracted side optics was a 0.18° parallel plate collimator and a flat graphite monocromator. A point detector was used.

Pole figure was extracted from the (0 0 6) plane and measured on the clearance side on a CNMG1208-PM insert. The step size in φ was 5° and the χ step size was 5°. The measurement time/step was 1.5 seconds. The scan range was 0-360° in φ and −0 to 80 in χ.

To evaluate the intensity distribution as a function of χ a scan in the χ axis was performed. The measurement was performed symmetric around χ=0° with a scan range of 70°, a step size of 2.5° and a time/step of 10 seconds.

The FWHM of the peak in the χ scan is a measure of alignment of planes {h k l} in parallel with the surface. i.e a single crystal will have a broadening equal to the instrument resolution and a randomly oriented material will not show any peak in the χ scan. The χ scan can be considered as a cut in the χ direction in the (0 0 6) pole figure.

The pole figure and χ-scan analyze of the α-$Al_2O_3$ layer was made in the corresponding way on the α-$Al_2O_3$ (0 0 12) plane.

Also in the case of pole figure and χ scan thin film correction needs to be applied to the intensities, taken into account the linear absorption coefficient of layer. Since the layer is of finite thickness the path length of the X-ray beam in the sample will vary as a function of the χ angle.

EXAMPLES

Embodiments of the present invention will be disclosed in more detail in connection with the following examples. The examples are to be considered as illustrative and not limiting embodiments. In the following examples coated cutting tools (inserts) were manufactured, analyzed and evaluated in cutting tests.

Example 1—Sample Preparation

Three types of coatings have been deposited in a radial Ion Bond type CVD reactor 530 size capable of housing 10.000 half-inch size cutting inserts. The three type of samples are called Sample A (invention), Sample B (invention) and Sample C (reference). The samples were inserts with the ISO type geometry CNMG 120408-PM.

The process parameters regarding the inner layer are identical in all three coatings. The inner layer includes TiN (approx. 0.4 µm), MT-TiCN (approx. 8 µm) and bonding layer (approx. 0.7 µm).

The inserts were first coated with a thin approximately 0.4 µm TiN-layer then with an approximately 8 µm TiCN layer (TiCN inner+TiCN outer) by employing the well-known MTCVD technique using $TiCl_4$, $CH_3CN$, $N_2$, HCl and $H_2$ at 885° C. The details of the TiN and the TiCN deposition are shown in Table 1.

TABLE 1

Process parameters TiN and MT-TiCN

| MT CVD of TiN and TiCN (885° C.): | Pressure [mbar] | $H_2$ [vol %] | $N_2$ [vol %] | HCl [vol %] | $TiCl_4$ [vol %] | $CH_3CN$ [vol %] |
|---|---|---|---|---|---|---|
| TiN | 400 | balance | 48.8 | — | 2.4 | — |
| TiCN inner | 55 | balance | 37.6 | — | 2.9 | 0.5 |
| TiCN outer | 55 | balance | 7.8 | 7.8 | 2.4 | 0.6 |

Deposition time for TiCN inner and TiCN outer was 10 and 240 minutes, respectively. On top of the MTCVD TiCN layer a 0.7 μm bonding layer was deposited at 1000° C. by a process consisting of four separate reaction steps. First a HTCVD TiCN step using $TiCl_4$, $CH_4$, $N_2$, HCl and $H_2$ at 400 mbar, then a second step (TiCNO-1) using $TiCl_4$, $CH_3CN$, CO, HCl, $N_2$ and $H_2$ at 70 mbar, then a third step (TiCNO-2) using $TiCl_4$, $CH_3CN$, CO, $N_2$ and $H_2$ at 70 mbar and finally a fourth step (TiN) using $TiCl_4$, $N_2$ and $H_2$ at 70 mbar. During the third and fourth deposition step some of the gases were continuously changed as indicated by a first start level and a second stop level presented in Table 2.

TABLE 2

Bonding layer

| Bonding layer (1000° C.) | Press [mbar] | $H_2$ [vol %] | $N_2$ [vol %] | $CH_4$ [vol %] | HCl [vol %] | CO [vol %] | $TiCl_4$ [vol %] | $CH_3CN$ [vol %] | $CO_2$ [vol %] |
|---|---|---|---|---|---|---|---|---|---|
| HTCVD-TiCN | 400 | balance | 25.5 | 3.4 | 1.7 | — | 1.5 | — | — |
| TiCNO-1 | 70 | balance | 12 | — | 1.2 | 1.2 | 1.5 | 0.4 | — |
| TiCNO-2 | 70 | balance | 31.5-30.6 | — | — | 1.6-4.6 | 3.15-3.06 | 0.66-0.62 | — |
| TiN | 70 | balance | 32.2 | — | — | — | 3.2 | — | — |

Sample A

On top of the inner layer a layer structure of {0 0 1}-textured α-alumina, TiN and {0 0 1}-textured κ-alumina were subsequently deposited in accordance with the following:

Initially the bonding layer (the inner layer) was oxidized for 4 minutes in a mixture of $CO_2$, CO, $N_2$ and $H_2$. The details of the bonding layer oxidation deposition are shown in Table 3.

TABLE 3

Oxidation

| | Pressure [mbar] | $H_2$ [vol %] | $N_2$ [vol %] | CO [vol %] | $CO_2$ [vol %] |
|---|---|---|---|---|---|
| Oxidation | 55 | balance | 30 | 12.5 | 3.7 |

On top of the oxidized bonding layer an α-$Al_2O_3$ layer was then deposited, see Table 4. The α-$Al_2O_3$ layer was deposited at 1000° C. and 55 mbar in two steps. The first step using 1.2 vol-% $AlCl_3$, 4.7 vol-% $CO_2$, 1.8 vol-% HCl and balance $H_2$ giving about 0.1 μm α-$Al_2O_3$ and a second step using 1.2% $AlCl_3$, 4.7% $CO_2$, 2.9% HCl, 0.58% $H_2S$ and balance $H_2$ giving a total α-$Al_2O_3$ layer thickness of about 1 μm.

TABLE 4

α-$Al_2O_3$ layer deposition

| α-Al2O3 (1000° C.): | Pressure [mbar] | $H_2$ [vol %] | HCl [vol %] | $CO_2$ [vol %] | $H_2S$ [vol %] | $AlCl_3$ [vol %] |
|---|---|---|---|---|---|---|
| $Al_2O_3$-1 | 55 | balance | 1.8 | 4.7 | — | 1.2 |
| $Al_2O_3$-2 | 55 | balance | 2.9 | 4.7 | 0.6 | 1.2 |

On top of the α-$Al_2O_3$ layer a thin TiN-layer of approximately 0.1 μm was deposited, see Table 5. This was done at 55 mbar and 1000° C. using 1.4% $TiCl_4$, 41.1% $N_2$ and balance $H_2$.

TABLE 5

TiN layer deposition

| TiN-layer (1000° C.): | Pressure [mbar] | $H_2$ [vol %] | $N_2$ [vol %] | $TiCl_4$ [vol %] |
|---|---|---|---|---|
| TiN-layer | 55 | balance | 41.1 | 1.4 |

On top of the thin TiN-layer, a κ-$Al_2O_3$ layer was deposited, see Table 6. The κ-$Al_2O_3$ layer was deposited at 1000° C. and 55 mbar in two steps. The first step using 1.2 vol-% $AlCl_3$, 4.7 vol-% $CO_2$, 1.8 vol-% HCl and balance $H_2$ giving about 0.1 μm $Al_2O_3$ and a second step using 1.2% $AlCl_3$, 4.7% $CO_2$, 2.9% HCl, 0.58% $H_2S$ and balance $H_2$ giving a total κ-$Al_2O_3$ layer thickness of about 4 μm.

TABLE 6

κ-$Al_2O_3$ layer deposition on Sample A.

| κ-Al2O3 (1000° C.): | Pressure [mbar] | $H_2$ [vol %] | HCl [vol %] | $CO_2$ [vol %] | $H_2S$ [vol %] | $AlCl_3$ [vol %] |
|---|---|---|---|---|---|---|
| $Al_2O_3$-1 | 55 | balance | 1.8 | 4.7 | — | 1.2 |
| $Al_2O_3$-2 | 55 | balance | 2.9 | 4.7 | 0.6 | 1.2 |

Sample B

Sample A and Sample B differs in the process parameters for the κ-$Al_2O_3$ layer deposition. All other process parameters were identical. For Sample B the κ-$Al_2O_3$ layer was deposited at 1000° C. and 55 mbar in two steps. The first step using 2.3 vol-% $AlCl_3$, 4.6 vol-% $CO_2$, 1.7 vol-% HCl and balance $H_2$ giving about 0.1 μm κ-$Al_2O_3$ and a second step using 2.2% $AlCl_3$, 4.4% $CO_2$, 5.5% HCl, 0.33% $H_2S$ and balance $H_2$ giving a total κ-$Al_2O_3$ layer thickness of about 4 μm. The process parameters are given in Table 7.

TABLE 7

κ-Al₂O₃ layer deposition on Sample B.

| κ-Al2O3 (1000° C.): | Pressure [mbar] | H₂ [vol %] | HCl [vol %] | CO₂ [vol %] | H₂S [vol %] | AlCl₃ [vol %] |
|---|---|---|---|---|---|---|
| Al₂O₃-1 | 55 | balance | 1.7 | 4.6 | — | 2.3 |
| Al₂O₃-2 | 55 | balance | 5.5 | 4.4 | 0.3 | 2.2 |

Sample C

A κ-Al₂O₃ layer of approximately 5 μm was deposited directly on the bonding layer (the inner layer) using the process parameters given in Table 7.

The layer thicknesses were analyzed in a light optical microscope by studying a cross section of each coating at 1000× magnification. The layer thicknesses are presented in Table 8.

TABLE 8

Layer thicknesses

| | Inner layer structure | | | Al₂O₃ layer structure | | |
|---|---|---|---|---|---|---|
| | TiN | TiCN | Bonding | α-Al₂O₃ | TiN | κ-Al₂O₃ |
| Sample A | | 9.1 μm | | | 5.4 μm | |
| | 0.4 μm | 8.0 μm | 0.7 μm | 1.2 μm | 0.1 μm | 4.1 μm |
| Sample B | | 9.7 μm | | | 4.8 μm | |
| | 0.4 μm | 8.6 μm | 0.7 μm | 1.0 μm | 0.1 μm | 3.7 μm |
| Sample C | | 9.7 μm | | | 4.5 μm | |
| | 0.4 μm | 8.6 μm | 0.7 μm | — | — | 4.5 μm |

Example 2—XRD Examination

The peak intensities in an XRD diffractogram was provided in accordance with the method described above. Thin film correction was applied to the intensities.

Figure 2:
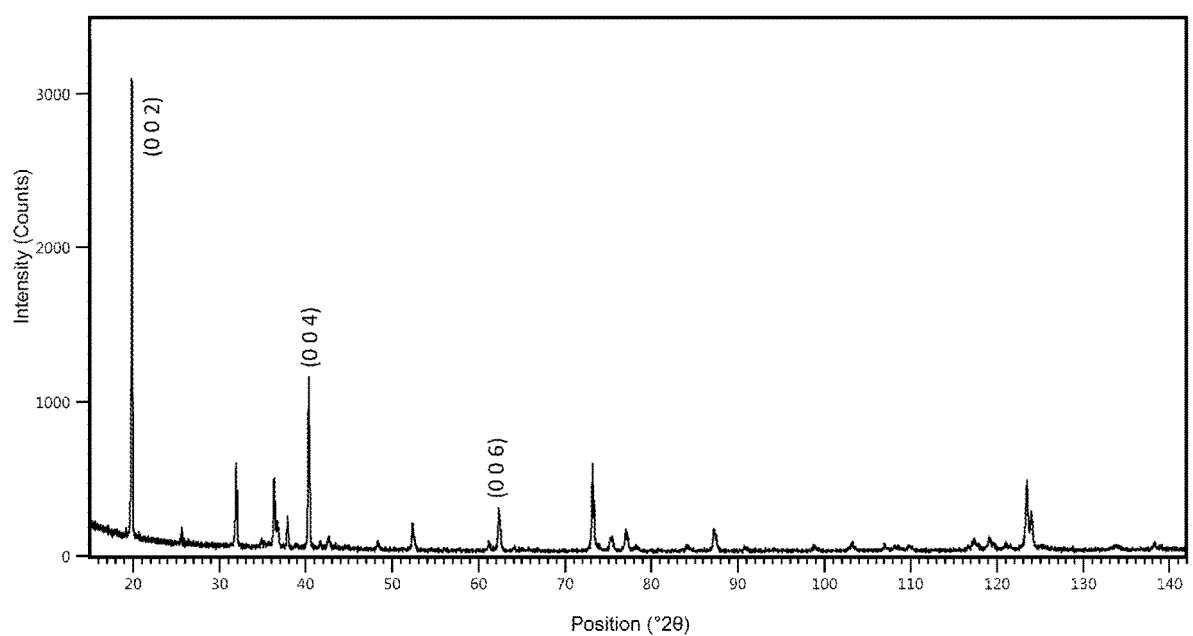
FIG. 2 is a θ-2θ XRD diffractogram from Sample A with no corrections applied on the intensities.

Diffractograms (no applied correction) from Sample A and Sample B are shown in FIG. 2 and FIG. 1, respectively. The peaks originating from the {0 0 1} planes show a strong intensity at 2θ=19.85°, 40.33° and 62.24° for (0 0 2), (0 0 4) and (0 0 6) planes respectively. Compared to ICDD's PDF card No. 00-052-0803 these peaks are supposed to have 11% 8% and 7% intensity for the (0 0 2), (0 0 4) and (0 0 6) planes respectively. The strongest peak according to PDF card 00-052-0803 is the (1 1 2) plane which is hardly observable in FIG. 1. The second strongest peak in PDF card 00-052-0803 is the (0 1 3) which can be observed as a weak peak in FIG. 1 and in FIG. 2. Thus, it is clear that the κ-Al₂O₃ layers of Sample A and Sample B show a strong texture with the {0 0 1} planes in parallel with the surface.

Figure 3:
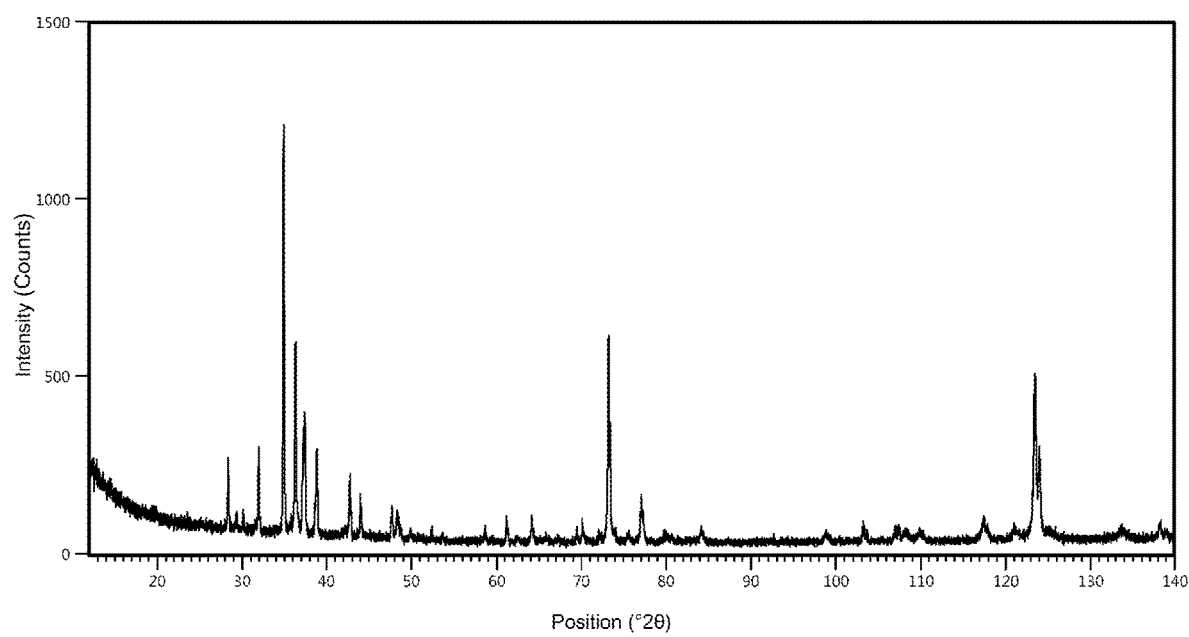
FIG. 3 is a θ-2θ XRD diffractogram from Sample C with no corrections applied on the intensities.

A diffractogram from Sample C is shown in FIG. 3. The peak originating from the κ-Al₂O₃ with the strongest intensity for Sample C is the (1 2 2) peak.

Table 9 lists the 2θ values for the κ-Al₂O₃ peaks that were used to determine the texture of the κ-Al₂O₃ layer of Sample A, B and C and table 10 lists the corrected intensities of these peaks.

TABLE 9

2θ values of peaks of κ-Al₂O₃

| h k l | 2θ (°) |
|---|---|
| 0 0 2 | 19.85° |
| 0 1 3 | 31.89° |
| 1 2 2 | 34.81° |
| 0 0 4 | 40.34° |
| 0 0 6 | 62.30° |

TABLE 10

Peak intensities from the κ-Al₂O₃ XRD diffractogram, normalized such that the highest peak is set to 100 in intensity.

| Peak (h k l) | Sample A | Sample B | Sample C |
|---|---|---|---|
| (0 0 2) | 100.0 | 100.0 | 1.1 |
| (0 1 3) | 38.6 | 13.9 | 21.2 |
| (1 2 2) | 5.3 | 3.9 | 100.0 |
| (0 0 4) | 93.7 | 97.4 | not visible |
| (0 0 6) | 51.7 | 52.8 | not visible |

Example 3—Pole Figure and χ-Scan Examination

Figure 6:
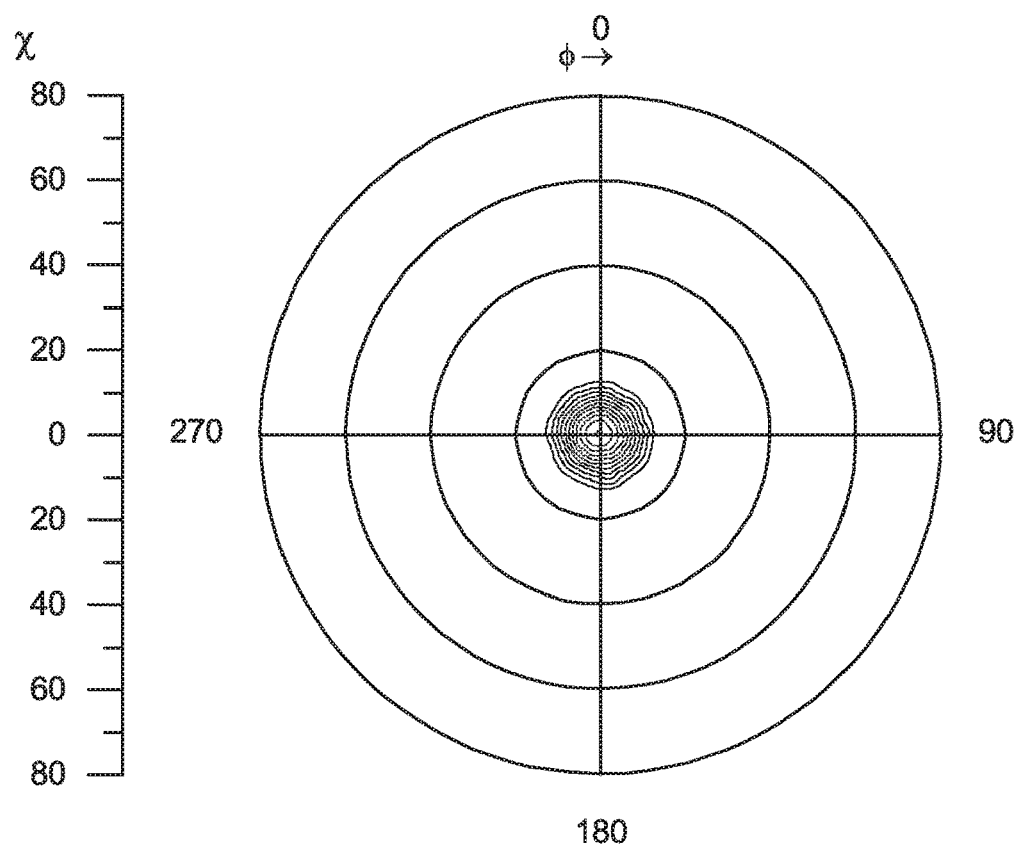
FIG. 6 is a (0 0 6) pole figure of Sample B wherein −80°≤χ≤80° and 0°≤φ≤360°.

The samples Sample B and Sample C were evaluated using {0 0 6} pole figures and χ-scan with the method as disclosed above. The pole figure of Sample B showed one peak centered around χ=0°, see FIG. 6. No such peak close to χ=0° was found in the pole figure of the reference Sample C.

Figure 4:
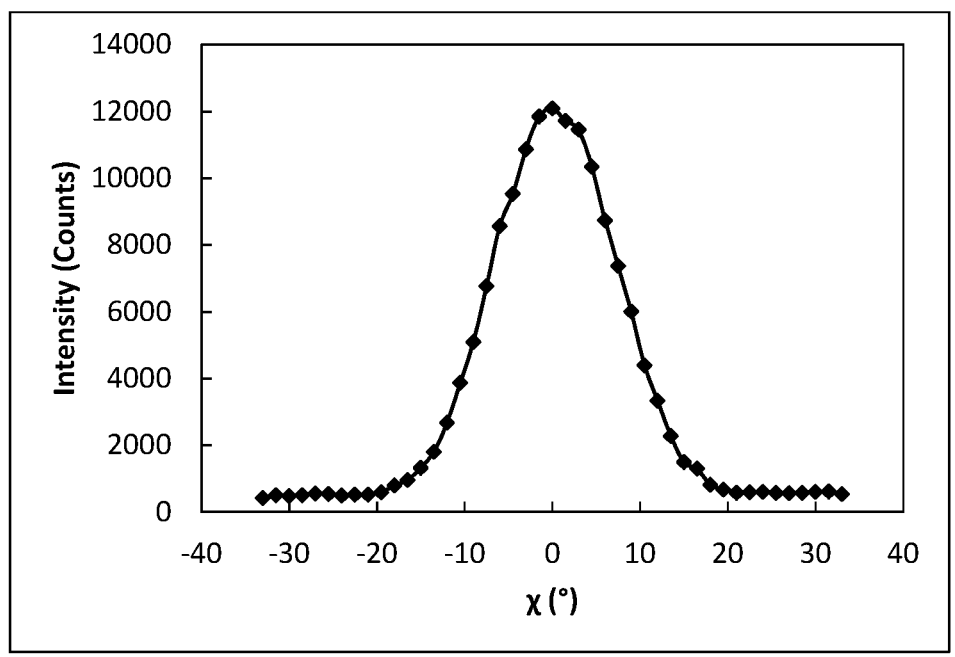
FIG. 4 is a χ-scan from the (0 0 6) plane of the κ-$Al_2O_3$ layer of Sample B. Thin film correction is applied to the intensities.

In the χ scan of the κ-Al₂O₃ (0 0 6) plane of Sample B one single sharp peak is noted which indicates a strong {0 0 1} texture and a high alignment of the {0 0 1} planes in parallel with the surface of the substrate. The χ scan of the Sample B is shown in FIG. 4. The one peak is centered around χ=0° with a FWHM of about 16.5°.

Figure 5:
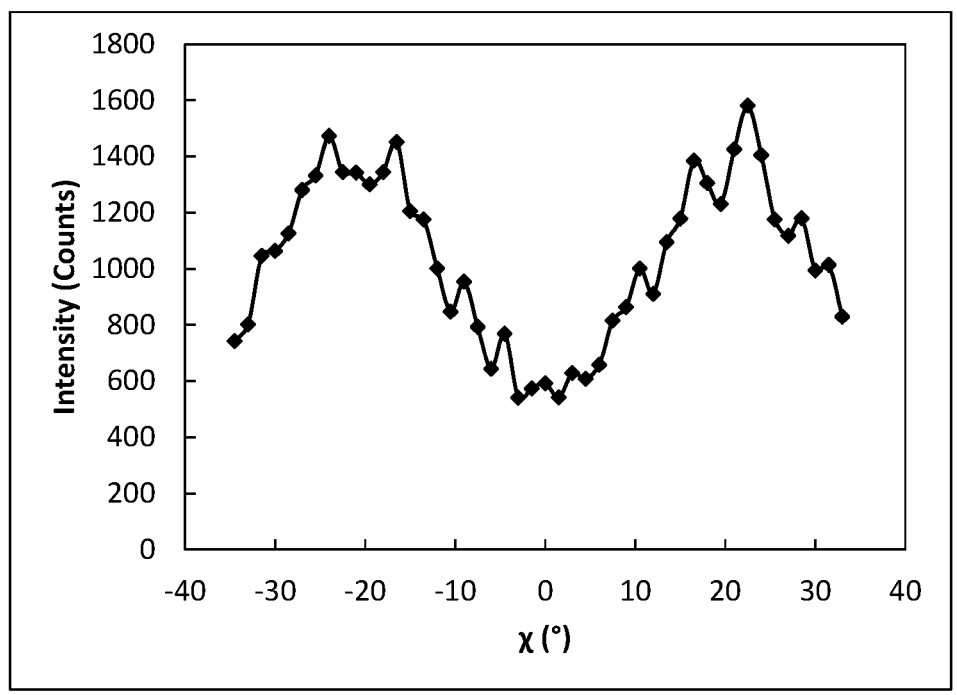
FIG. 5 is a χ-scan from the (0 0 6) plane of the κ-$Al_2O_3$ layer of Sample C. Thin film correction is applied to the intensities.

A χ scan from the κ-Al₂O₃ (0 0 6) plane in the reference Sample C is shown in FIG. 5. As can be observed no sharp peak is observed centered around χ=0° rather two local maxima at roughly χ=±20° is shown.

Figure 7:
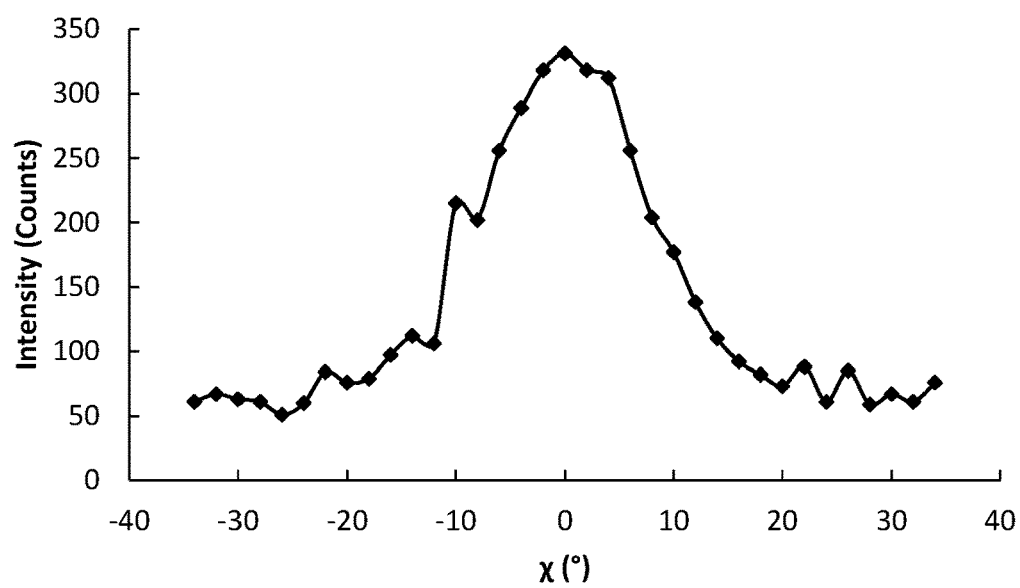
FIG. 7 is a χ-scan from the (0 0 12) plane of the α-$Al_2O_3$ layer of Sample B. Notice that no correction is applied to the intensities.

In the χ scan of the α-Al₂O₃ (0 0 12) plane of Sample B one single peak is noted around χ=0° which indicates a strong {0 0 1} texture and a high alignment of the {0 0 1} planes in parallel with the surface of the substrate. The χ scan of the Sample B is shown in FIG. 7. The one peak is centered around χ=0° with a FWHM of about 17°.

Example 4—Crater Wear Test

The coated cutting tools, i.e. Samples A, B and C were tested in longitudinal turning in ball bearing steel (Ovako 825B) using the following cutting data;
Cutting speed $v_c$: 220 m/min
Cutting feed, f: 0.3 mm/revolution
Depth of cut, ap: 2 mm
Insert style: CNMG120408-PM
Water miscible metal working fluid was used.
One cutting edge per cutting tool was evaluated.
In analyzing the crater wear, the area of exposed substrate was measured, using a light optical microscope. When the surface area of the exposed substrate exceeded 0.2 mm² the life time of the tool was considered to be reached. The wear of each cutting tool was evaluated after 2 minutes cutting in the light optical microscope. The cutting process was then continued with a measurement after each 2 minutes run, until the tool life criterion was reached. When the size of the crater area exceeded 0.2 mm² the time until the tool life criterion was met was estimated based on an assumed constant wear rate between the two last measurements. Beside crater wear, flank wear was also observed, but did not in this test influence the tool life. The average results of two parallel tests are shown in Table 11.

TABLE 11

| Crater wear resistance | | | |
|---|---|---|---|
| | Sample | | |
| | Sample A | Sample B | Sample C |
| Life time (min) | 31 | 34 | 22 |

While the invention has been described in connection with the above exemplary embodiments, it is to be understood that the invention is not to be limited to the disclosed exemplary embodiments; on the contrary, it is intended to cover various modifications and equivalent arrangements within the appended claims.

The invention claimed is:

1. A coated cutting tool comprising a substrate and a coating, wherein the coating comprises at least one layer of $\kappa\text{-Al}_2\text{O}_3$ with a thickness of 1-20 μm deposited by chemical vapor deposition, wherein a $\chi$-scan from −80° to 80° over a (0 0 6) reflection of said $\kappa\text{-Al}_2\text{O}_3$ layer shows the strongest peak centered around 0° and wherein a FWHM of said peak is <25°.

2. The coated cutting tool in accordance with claim 1, wherein the strongest peak from the $\kappa\text{-Al}_2\text{O}_3$ layer in an X-ray diffractogram from 15° to 140° is a (0 0 2) reflection.

3. The coated cutting tool in accordance with claim 2, wherein the second strongest peak from the $\kappa\text{-Al}_2\text{O}_3$ layer in an X-ray diffractogram from 15° to 140° is a (0 0 4) reflection.

4. The coated cutting tool in accordance with claim 3, wherein the third strongest peak from the $\kappa\text{-Al}_2\text{O}_3$ layer in an X-ray diffractogram from 15° to 140° is the (0 0 6) reflection.

5. The coated cutting tool in accordance with claim 1, wherein an average thickness of the $\kappa\text{-Al}_2\text{O}_3$ layer is 2-10 μm.

6. The coated cutting tool in accordance with claim 1, wherein the coating further comprises an $\alpha\text{-Al}_2\text{O}_3$ layer.

7. The coated cutting tool in accordance with claim 6, wherein said $\alpha\text{-Al}_2\text{O}_3$ layer is located between said $\kappa\text{-Al}_2\text{O}_3$ layer and the substrate.

8. The coated cutting tool in accordance with claim 6, wherein the thickness of said $\alpha\text{-Al}_2\text{O}_3$ layer is 0.5-2 μm.

9. The coated cutting tool in accordance with claim 1, wherein the coating further comprises one or more layers of TiN, TiCN, TiC, TiCO, TiAlCO and TiCNO.

10. The coated cutting tool in accordance with claim 6, wherein a layer of one or more of TiN, TiC, TiCN, TiCO, TiCNO, TiAlCO is located between said $\alpha\text{-Al}_2\text{O}_3$ layer and said $\kappa\text{-Al}_2\text{O}_3$ layer.

11. The coated cutting tool of claim 10, wherein the thickness of said layer of one or more of TiN, TiC, TiCN, TiCO, TiCNO, TiAlCO is ≤0.5 μm.

12. The coated cutting tool in accordance with claim 1, wherein the coating comprises layers in the following order as seen from the surface of the substrate TiN, TiCN, TiCNO, $\alpha\text{-Al}_2\text{O}_3$, TiN and $\kappa\text{-Al}_2\text{O}_3$.

13. The coated cutting tool in accordance with claim 1, wherein the coating comprises an outermost wear indicating color layer.

* * * * *